(12) United States Patent
Katoh et al.

(10) Patent No.: US 7,812,248 B2
(45) Date of Patent: Oct. 12, 2010

(54) LIGHT TRANSMISSIBLE SOLAR CELL MODULE, PROCESS FOR MANUFACTURING SAME, AND SOLAR CELL PANEL THEREOF

(75) Inventors: Kazuya Katoh, Arlington, MA (US); Yasukazu Nakata, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 12/648,878

(22) Filed: Dec. 29, 2009

(65) Prior Publication Data

US 2010/0101629 A1  Apr. 29, 2010

Related U.S. Application Data

(62) Division of application No. 11/678,377, filed on Feb. 23, 2007.

(51) Int. Cl.
*H01L 31/052* (2006.01)
(52) U.S. Cl. ..................... 136/246; 52/173.3
(58) Field of Classification Search ......... 136/243–265, 136/291; 52/173.3
See application file for complete search history.

(56) References Cited

U.S. PATENT DOCUMENTS

| | | | |
|---|---|---|---|
| 4,137,098 A | 1/1979 | Field | |
| 6,311,437 B1 | 11/2001 | Lorenz | |
| 6,311,437 B1 * | 11/2001 | Lorenz | ..................... 52/173.3 |
| 6,688,053 B2 | 2/2004 | Winarski | |
| 2003/0068513 A1 | 4/2003 | Kubota et al. | |

FOREIGN PATENT DOCUMENTS

| | | |
|---|---|---|
| JP | 59-157096 | 10/1984 |
| JP | 62-205668 A | 9/1987 |
| JP | 64-055876 A | 3/1989 |
| JP | A-05-259494 A | 10/1993 |
| JP | 06-177408 A | 6/1994 |
| JP | 10-079522 A | 3/1998 |
| JP | 10-242491 A | 9/1998 |

(Continued)

OTHER PUBLICATIONS

Nikkei Microdevices, Mar. 2006, pp. 25-45.

(Continued)

*Primary Examiner*—Jessica L Ward
*Assistant Examiner*—Kevin E Yoon
(74) *Attorney, Agent, or Firm*—Wood, Herron & Evans, L.L.P.

(57) ABSTRACT

A light transmissible solar cell module including: solar cell units, which include a transparent substrate, a mirror electrode layer provided on a part of a surface of the transparent substrate, and a solar cell section provided on the mirror electrode layer, arranged in multi-levels; a first connecting wire electrically connected to an electrode provided on a surface side of the solar cell section; and a second connecting wire electrically connected to the mirror electrode layer, wherein the solar cell units are arranged so that a light entering from one side hits the solar cell section of an arbitrary solar cell unit and is reflected, and the reflected light reaches another side by being reflected by the mirror electrode layer of a solar cell unit arranged adjacent to the arbitrary solar cell unit.

5 Claims, 17 Drawing Sheets

FOREIGN PATENT DOCUMENTS

| | | |
|---|---|---|
| JP | 11-117642 A | 4/1999 |
| JP | 2000-261022 A | 9/2000 |
| JP | 2002-314114 | 10/2002 |
| JP | 2003-123332 | 4/2003 |
| JP | 2004-349657 A | 12/2004 |

OTHER PUBLICATIONS

Denshi Zairyo, Feb. 2006, pp. 67-73.
Convertech, Sep. 2006, pp. 49-54.
Japanese Patent Office, Search Report in International Patent Application No. PCT/JP2008/052867 dated May 27, 2008.

* cited by examiner

LIGHT TRANSMISSIBLE SOLAR CELL MODULE, PROCESS FOR MANUFACTURING SAME, AND SOLAR CELL PANEL THEREOF

CROSS REFERENCE TO RELATED APPLICATIONS

This application is a Divisional of U.S. patent application Ser. No. 11/678,377 entitled "LIGHT TRANSMISSIBLE SOLAR CELL MODULE, PROCESS FOR MANUFACTURING SAME, AND SOLAR CELL PANEL THEREOF" filed Feb. 23, 2007 (pending), the disclosure of which is hereby incorporated by reference herein.

BACKGROUND OF THE INVENTION

1. Field of the Invention

The present invention relates to a light transmissible solar cell module having superior light transmissibility and excellent power generating efficiency, a process for manufacturing the same, and a solar cell panel, thereof. The light transmissible solar cell module and the solar cell panel of the present invention are suitable for installation on a window of a building, a ceiling that can take in outside light, and the like.

2. Background Art

Examples of the background art of solar cell modules and solar cell panels (hereinafter collectively referred to as "solar cells") include the technologies disclosed in Japanese Laid-Open Patent Application No. 2002-314114; Nikkei Microdevices, March 2006, pages 25 to 45; Denshi Zairyo, February 2006, pages 67 to 72; and Convertech, September 2006, pages 49 to 54.

SUMMARY OF THE INVENTION

In a solar cell, if a part of the irradiated light can be transmitted, solar power generation by the solar cell as well as use of the transmitted light as a part of indoor illumination becomes possible. This type of solar cell is thus suitable for installation on a window of a building, a ceiling that can take in outside light, and the like.

In the background art of solar cells that are light transmissible and that can be installed on a window of a building and the like, dye solar cells (dye-sensitized solar cells) being either a type in which crystalline solar cells formed on silicon wafer substrates are placed at appropriate distances and sandwiched by glass or a type in which microscopic pores are provided in a thin-film solar cell having a crystalline silicon thin film formed by a PE-CVD method or the like are known. However, crystalline solar cells and thin-film solar cells have inferior light transmissibility and there is the problem that if light transmissibility is attempted to be ensured, power generation efficiency deteriorates. Dye-sensitized solar cells lack power generation efficiency and are also highly colored. There is thus the problem that good illumination cannot be obtained.

In consideration of the above-mentioned circumstances, an object of the present invention is to provide light transmissible solar cells having superior light transmissibility and excellent power generating efficiency.

In order to fulfill the above-mentioned object, the present invention provides a light transmissible solar cell module including:

solar cell units, which include a transparent substrate, a mirror electrode layer provided on a part of a surface of the transparent substrate, and a solar cell section provided on the mirror electrode layer, arranged in multi-levels;

a first connecting wire electrically connected to an electrode provided on a surface side of the above-mentioned solar cell section; and a second connecting wire electrically connected to the above-mentioned mirror electrode layer, wherein the solar cell units are arranged so that a light entering from one side hits the solar cell section of an arbitrary solar cell unit and is reflected, and the reflected light reaches another side by being reflected by the mirror electrode layer of a solar cell unit arranged adjacent to the above-mentioned arbitrary solar cell unit.

It is preferable in the light transmissible solar cell module of the present invention that the above-mentioned mirror electrode layer is provided on one surface of the multiple projecting portions of a transparent substrate including multiple projecting portions with a saw edge-like cross-section formed by connecting projecting portions having a first surface and a second surface that intersects with the first surface, and that the solar cell section is provided on the mirror electrode layer.

It is preferable in the light transmissible solar cell module of the present invention that the entire module is formed into a plate-like shape by filling the hollows between the projecting portions of the above-mentioned multiple projecting portions with a transparent resin.

In the light transmissible solar cell module of the present invention, the above-mentioned solar cell unit may have a structure in which the above-mentioned mirror electrode layer and the above-mentioned solar cell section are layered sequentially on a first surface of a transparent substrate having approximately parallel first and second surfaces, and transparent substrates of a plurality of the solar cell units are connected in a line.

It is preferable in the light transmissible solar cell module of the present invention that the above-mentioned transparent substrates are connected in a line using a transparent adhesive.

Also, the present invention provides a process for manufacturing a light transmissible solar cell module including: forming a mirror electrode layer by forming a metallic material as a film on one surface of the multiple projecting portions of a transparent substrate including multiple projecting portions with a saw edge-like cross-section formed by connecting projecting portions having a first surface and a second surface that intersects with the first surface; subsequently, forming a solar cell section by forming a semi-conductor material as a film on the mirror electrode layer; and subsequently, obtaining the light transmissible solar cell module by forming a first connecting wire electrically connected with an electrode provided on a surface side of the above-mentioned solar cell section and a second connecting wire electrically connected to the above-mentioned mirror electrode layer.

It is preferable in the above-mentioned process that after forming the first connecting wire, the entire module is formed into a plate-like shape by filling the hollows between the projecting portions of the above-mentioned multiple projecting portions with a transparent resin.

Furthermore, the present invention provides a process for manufacturing a light transmissible solar cell module including:

forming a mirror electrode layer by making a first surface of a transparent substrate having approximately parallel first and second surfaces in the upper direction and making the second surface of the transparent substrate having approximately parallel first and second surfaces in the lower direction, by closely arranging a plurality of transparent substrates in a band-like or a flat plate-like shape, and by forming a metallic material as a film on the first surface of the above-mentioned transparent substrates;

subsequently, forming a solar cell section by forming a semiconductor material as a film on the mirror electrode layer to manufacture a solar cell unit;

subsequently, stacking the obtained solar cell units so that the top of the solar cell section of an arbitrary solar cell unit is contacted by the second surface of the transparent substrate of another solar cell unit; and subsequently, obtaining the light transmissible solar cell module by forming a first connecting wire electrically connected with an electrode provided on a surface side of the above-mentioned solar cell section and a second connecting wire electrically connected with the above-mentioned mirror electrode layer.

It is preferable in the above-mentioned process that a plurality of solar cell units are stacked by using a transparent adhesive between each of the solar cell units.

It is preferable in the above-mentioned process that after stacking the plurality of solar cell units, a transparent resin film is laminated around at least a part of the light transmissible solar cell module.

It is preferable in the above-mentioned process that after stacking the plurality of solar cell units, a transparent resin film is coated around at least a part of the light transmissible solar cell module.

Even further, the present invention provides a solar cell panel formed by fixing light transmissible solar cell modules according to the present invention in a casing.

BRIEF DESCRIPTION OF THE DRAWINGS

Some of the features and advantages of the invention having been described, others will become apparent from the detailed description which follows, and from the accompanying drawings, in which.

DESCRIPTION OF THE PREFERRED EMBODIMENTS

The invention summarized above and defined by the enumerated claims may be better understood by referring to the following detailed description, which should be read with reference to the accompanying drawings. This detailed description of particular preferred embodiments, set out below to enable one to build and use particular implementation of the invention, is not intended to limit the enumerated claims, but to serve as particular examples of the invention.

FIGS. 1 to 8 are diagrams showing a first embodiment of a light transmissible solar cell module according to the present invention.

Figure 1:
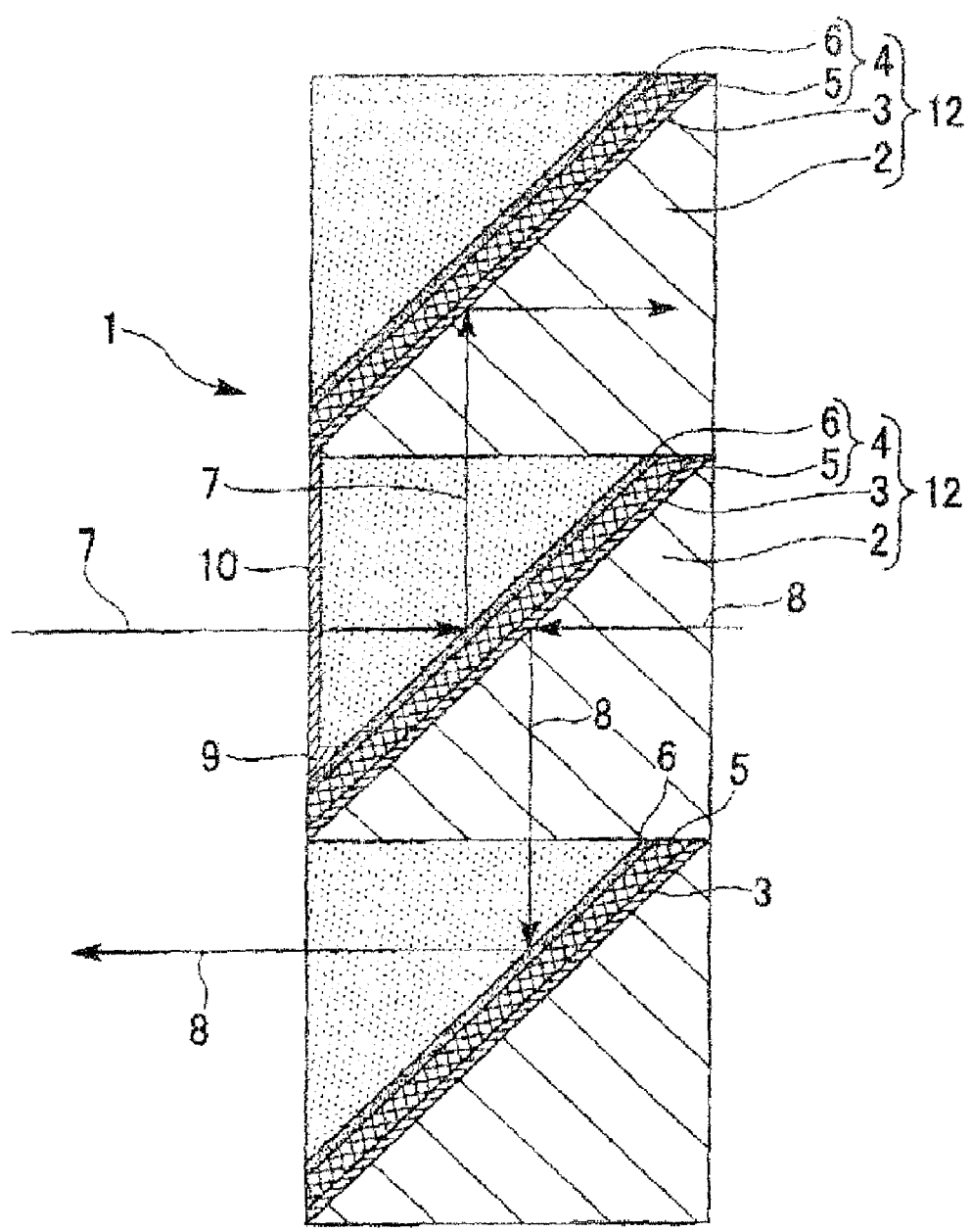
FIG. 1 is a cross-sectional view showing the main part of the basic structure of a light transmissible solar cell module according to the present invention.

A light transmissible solar cell module 1 of the present embodiment includes: solar cell units 12, which include a transparent substrate 2, a mirror electrode layer 3 provided on a part of a surface of the transparent substrate 2, and a solar cell section 4 provided on the mirror electrode layer 3, arranged in multi-levels; a first connecting wire 10 electrically connected with an electrode 9 provided on a surface side of the solar cell unit 4; and a second connecting wire 13 electrically connected with the mirror electrode layer 3. As shown in FIG. 1, the solar cell units 12 are arranged so that a light 7 entering from the outside (one side) hits the solar cell unit 4 of an arbitrary solar cell unit 12 and is reflected, and the reflected light reaches the inside (another side) by being reflected by the mirror electrode layer 3 of the solar cell unit 12 arranged adjacent to and above the above-mentioned solar cell unit 12. Also, as shown in FIG. 1, in the light transmissible solar cell module 1, a light 8 exiting from the inside (one side) to the outside (another side) hits the mirror electrode layer 3 of an arbitrary solar cell unit 12 and is reflected, and this reflected light hits the solar cell section 4 of the solar cell unit 12 arranged below and after power generation, is sent outside.

In the light transmissible solar cell module 1 of the present embodiment, a transparent substrate 2 including multiple projecting portions with a saw edge-like cross-section by connecting projecting portions including a first surface and a second surface which intersects with the first surface is used as the transparent substrate 2. Also, the above-mentioned mirror electrode layer 3 is provided on one surface of the multiple projecting portions of the transparent substrate 2 and the solar cell section 4 is provided on the mirror electrode layer 3. Furthermore, the entire module is formed into a plate-like shape by filling the hollows between the projecting portions of these multiple projecting portions with a transparent resin 11.

As the material of the transparent substrate 2, a transparent synthetic resin material or glass can be used. In particular, from the points of being able to lighten the module, ease of mass production, and being able to manufacture a module with a large area inexpensively, the use of a transparent synthetic resin is preferable. A polycarbonate resin, a polyester resin, a polystyrene resin, a polymethacrylate ester resin, a polycycloolefin resin, resins obtained by giving these resins further weather resistance, or the like can be used as the transparent synthetic resin. Also, the above-mentioned transparent resin 11 can be manufactured using the same materials as the above-mentioned transparent substrate 2. In particular, an ultraviolet-curable acrylic urethane resin, an epoxy acrylate, or the like, which can easily fill the hollows between the projecting portions of the multiple projecting portions and cure, is preferable.

It is only necessary that the material of the above-mentioned mirror electrode layer 3 have a light reflecting property and examples include metallic thin films of a metal such as aluminum (Al), silver (Ag), gold (Au), or chromium (Cr). The mirror electrode layer 3 comprising these metallic thin films has a film thickness so that light can be almost entirely reflected and as long as the electrical connecting resistance with the solar cell section 4 (p-type semiconductor layer 5) formed as a film on the mirror electrode layer 3 is not sufficiently small, there are not particular limitations. There are no particular limitations to the method for forming these metallic thin films on the first surface of the transparent substrate 2 and a thin film-forming means such as a vacuum deposition method or a sputtering method, or a film-forming method such an electroless plating method or a combination of an electroless plating method and an electrolytic plating method can be used.

The above-mentioned solar cell section 4 includes the p-type semiconductor layer 5 provided on the above-mentioned mirror or electrode layer 3 and an n-type semiconductor layer 6 provided on the p-type semiconductor layer 5. In the present invention, it is only necessary that the solar cell section 4 generate power by irradiating light and can be selected from the various types of conventionally well-known solar cells described in, for example, the above-mentioned three non-patent documents, such as crystalline solar cells such as single-crystal silicon solar cells, multi-crystal silicon solar cells, spherical silicon solar cells, and semiconductor solar cells of compounds such as GaAs; and thin film solar cells such as amorphous silicon solar cells, amorphous silicon/crystal silicon solar cells, and CIS ($CuInSe_2$).

At an end of a surface of the solar cell 4, an electrode 9, which is electrically connected with the n-type semiconductor layer 6, is provided. The electrode 9 can be formed by, after formation of the n-type semiconductor layer 6, only forming a metallic thin film on the end of the surface of the solar cell section 4 by using the metallic film and the film-forming method used when forming the mirror electrode layer 3 or similar to the below-mentioned formation of the connecting wires 10, 13, formed by a method such as applying an electrically conductive paste such as a silver paste by an appropriate printing method such as a screen printing method or an ink-jet printing method, and curing the paste.

The above-mentioned first connecting wire 10 is provided so as to be electrically connected with the electrode 9 provided on the surface side of the solar cell section 4. Also, the above-mentioned second connecting wire 13 is provided so as to be electrically connected with the mirror electrode layer 3. These connecting wires 10, 13 can be formed by a method such as applying an electrically conductive paste such as a silver paste by an appropriate printing method such as a screen printing method or an ink-jet printing method, and curing the paste.

Figure 2:
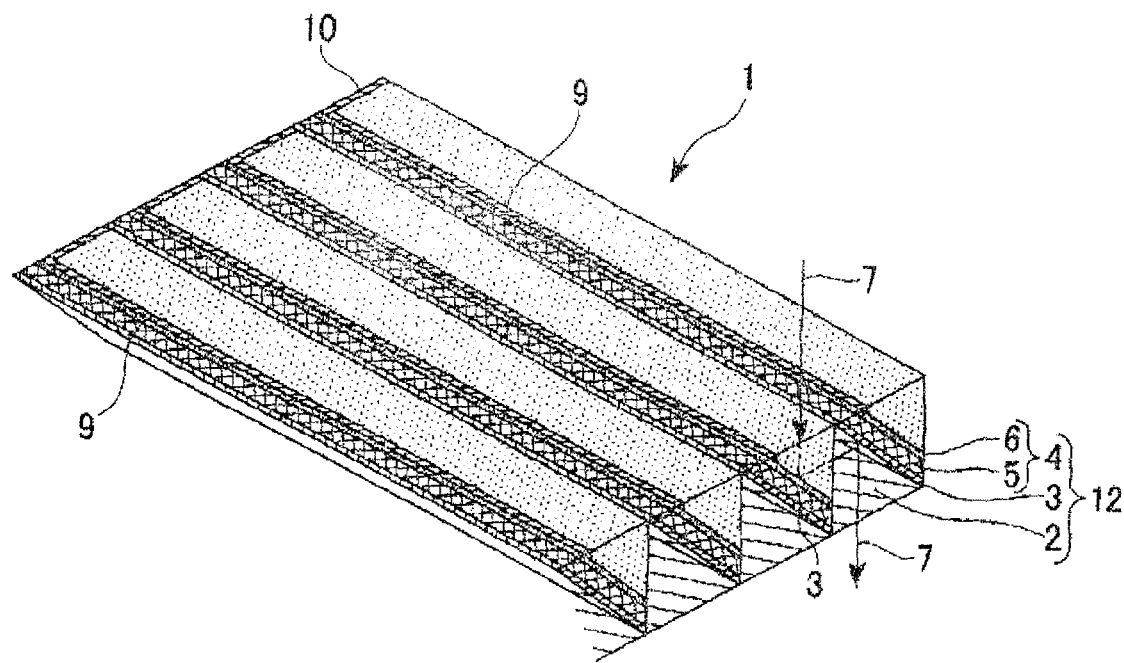
FIG. 2 is a perspective view showing the main part of a light transmissible solar cell module having a series-connection structure as a first embodiment of a light transmissible solar cell module according to the present invention.
Figure 3:
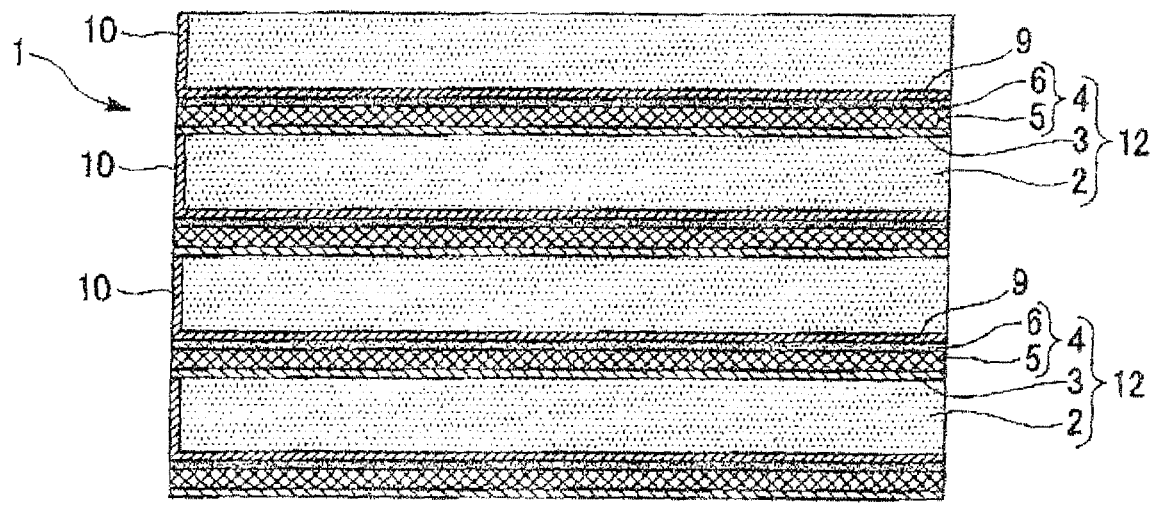
FIG. 3 is a side view showing the light transmissible solar cell module having a series-connection structure as the first embodiment of a light transmissible solar cell module according to the present invention.
Figure 4:
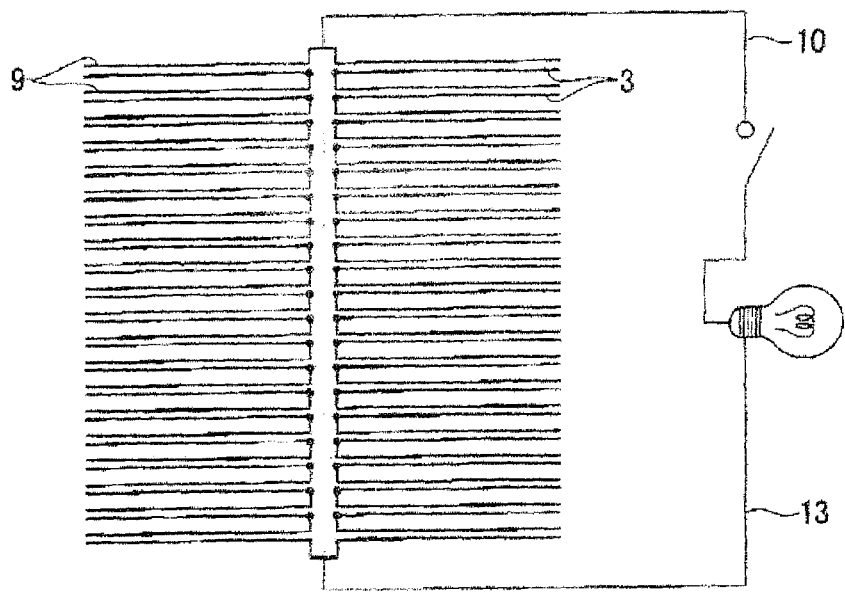
FIG. 4 is a circuit diagram showing the light transmissible solar cell module having a series-connection structure as the first embodiment of a light transmissible solar cell module according to the present invention.

FIGS. 2 to 4 are diagrams showing a configuration of the connecting wires in the light transmissible solar cell module 1 of the present embodiment. The configuration of the connecting wires according to the present example is the situation when the electrode 9 of each solar cell unit 12 is connected in series by the first connecting wire 10.

Figure 5:
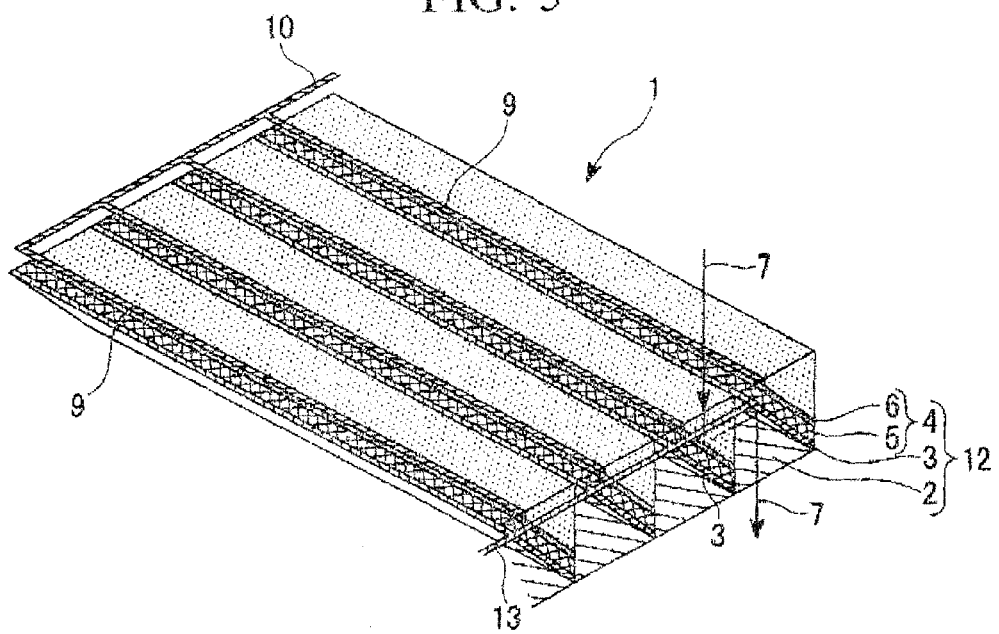
FIG. 5 is a perspective view showing the main part of a light transmissible solar cell module having a parallel-connection structure as the first embodiment of the light transmissible solar cell module according to the present invention.
Figure 6:
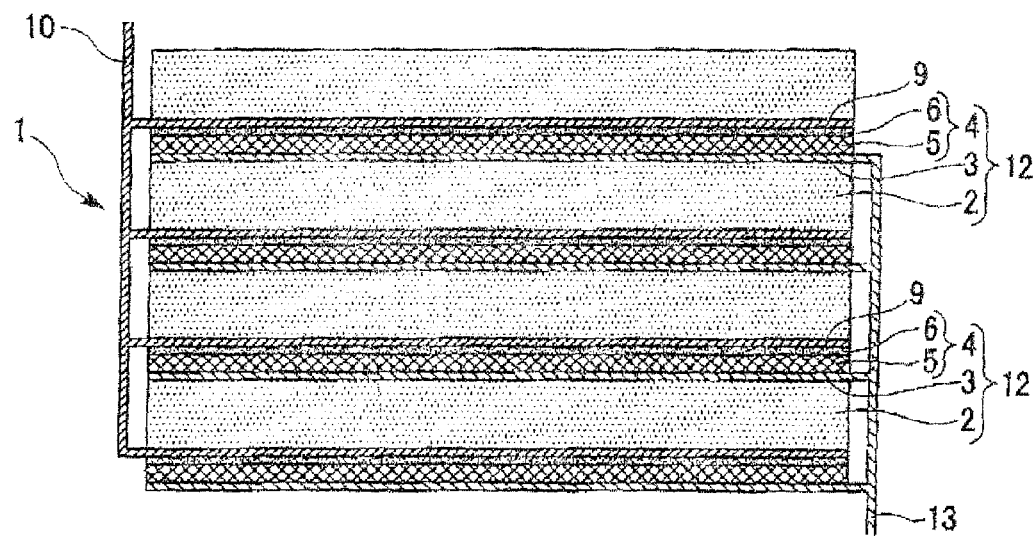
FIG. 6 is a side view showing the light transmissible solar cell module having a parallel-connection structure as the first embodiment of a light transmissible solar cell module according to the present invention.
Figure 7:
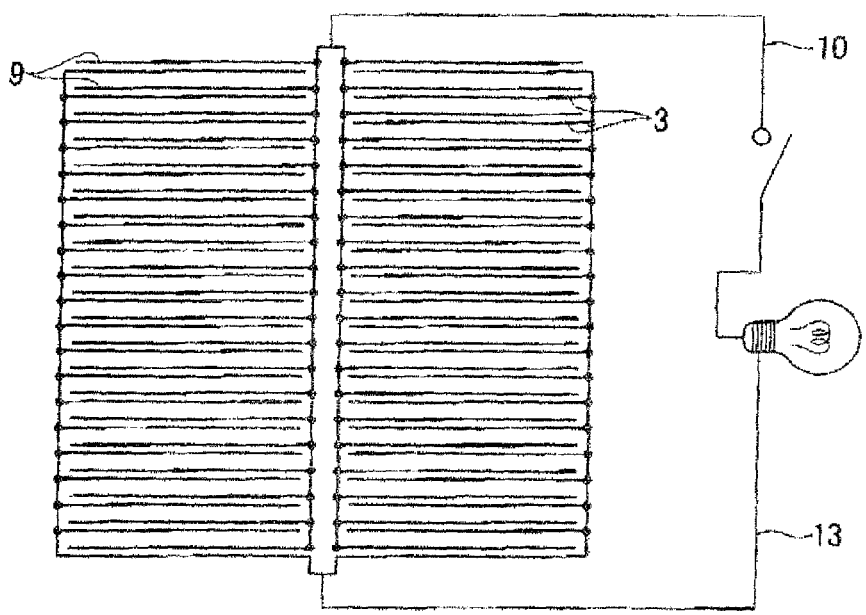
FIG. 7 is a circuit diagram showing the light transmissible solar cell module having a parallel-connection structure as the first embodiment of the light transmissible solar cell module according to the present invention.

FIGS. 5 to 7 are diagrams showing a second example of a configuration of the connecting wires in the light transmissible solar cell module 1 of the present embodiment. The configuration of the connecting wires according to the present example is the situation when the electrode 9 of each solar cell unit 12 is connected in parallel by the first connecting wire 10.

Figure 8:
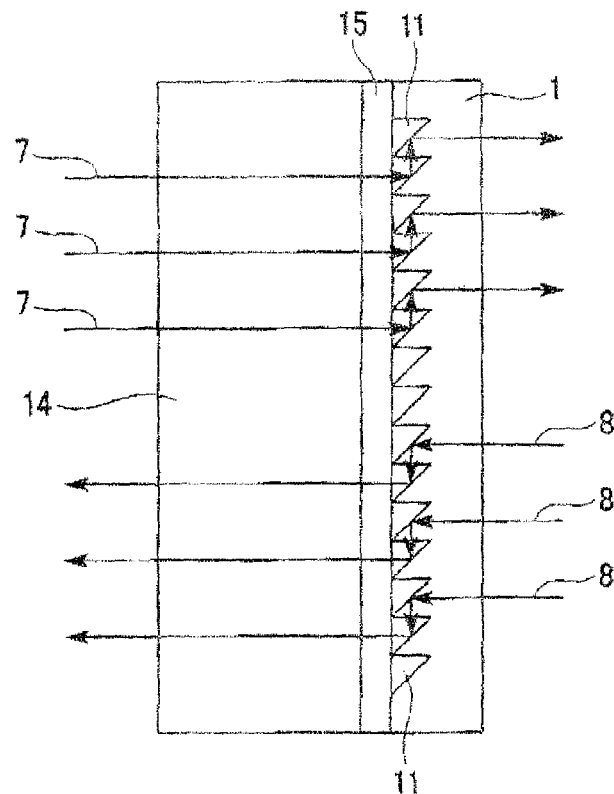
FIG. 8 is a schematic cross-sectional view showing the situation when a light transmissible cell module of the first embodiment is fixed to a window.

FIG. 8 is a diagram showing the situation when the light transmissible solar cell module 1 of the present embodiment is installed on a window. The light transmissible solar cell module 1 can be installed either on the indoors side or the outdoors side of a window glass 14. The light transmissible solar cell module 1 may be fixed to a window by a screw or the like using an appropriate window frame fixing tool and can also be fixed to the window glass 14 by integrally joining a window film 15 to a light-entering side of the light transmissible solar cell module 1 and adhesively fixing an adhesion surface of the window film 15 to the window glass 14. Also, the light transmissible solar cell module 1 can be directly attached to window glass 14 using an adhesive.

As shown in FIG. 1 to 8, when the light transmissible solar cell module 1 of the present embodiment is installed on a window, the light 7, which enters from the window, hits the solar cell section 4 and voltage is generated between both electrodes. The generated power is removed by the first connecting wire 10 and the second electrode 13, and can be used for various purposes. At the same time, the light reflected by the solar cell section 4 is reflected by the mirror electrode layer 3, which is above the solar cell section 4, reaches the inside by passing through the transparent substrate 2, and can be then used as illumination.

Also, a light 8 which exits from the inside to the outside is reflected by the mirror electrode layer 3 and hits the solar cell section 4, which is below the mirror electrode layer 3, and voltage is generated between both electrodes. The generated power is removed by the first connecting wire 10 and the second connecting wire 13, and can then be used for various purposes.

Although the usage form of the light transmissible solar cell module 1 shown in FIG. 8 is an example showing when the light transmissible solar cell module 1 is installed on the window glass 14, the usage form of the light transmissible solar cell module 1 is not limited to this and can have various usage forms such as, a ceiling which can take in outside light, a solar generation facility outside a building, a light transmissible rain shelter, a sound abatement wall for a highway or a railroad, or a ceiling material.

Figure 9:
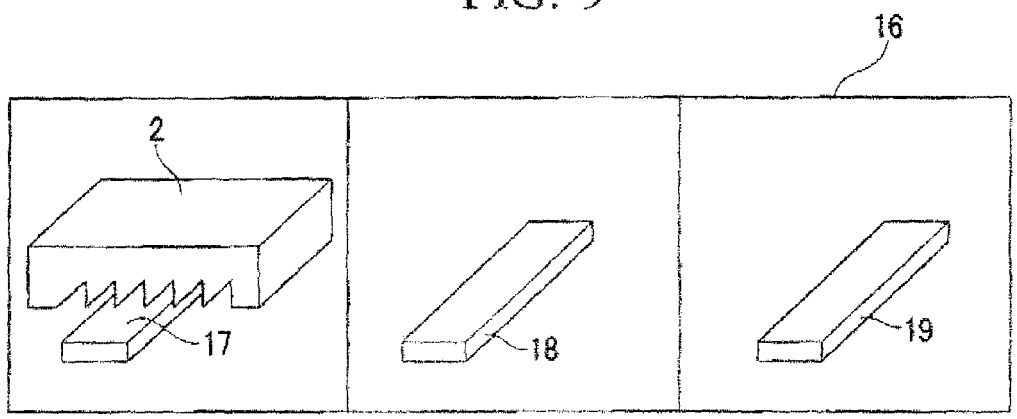
FIG. 9 is a schematic block diagram explaining an example of a process for manufacturing a light transmissible solar cell module according to the present invention.

FIG. 9 is a diagram explaining the situation when the above-mentioned light transmissible solar cell module 1 is manufactured as an example of a process for manufacturing a light transmissible solar cell according to the present invention.

In the manufacturing process according to the present example, firstly, the transparent substrate 2 having multiple projecting portions of a saw edge-like cross-section formed by the connection of projecting portions having the first surface and the second surface that intersects with the first surface is prepared, and this is put into a thin-film forming device that can make the films of the metallic material 17, which becomes the mirror electrode 3, and semiconductor materials 18 and 19, which form the solar cell section 4. The film forming device may have individual chambers 16 consecutively joined so that these materials can be consecutively formed as films or may be one film forming device where sequential film forming is carried out.

Examples of this film-forming method include thin-film forming processes such as a vacuum deposition method, a sputtering method, or a CVD method. When each film layer is formed on the substrate 2 by these thin-film forming processes, it is desirable that a plurality of solar cell units 12 is formed by the above-mentioned transparent substrate 2 and one or both of each of the above-mentioned materials being set so as to be capable of relative movement in the vacuum chamber 16 that can be maintained in a high vacuum state and by sequentially forming the mirror electrode layer 3, the p-type semiconductor layer 5, and the n-type semiconductor layer 6 as films on the first surface of the transparent substrate 2. When each layer is formed, although binding of each of the layers to the second surface of the transparent substrate 2 can be suppressed by accurately controlling the angle of the projecting portions having a saw edge-like cross-section, it is desirable to locally cover by a mask or form a resist film so that the material of each of each of the layers does not bind to the second surface of the transparent substrate 2.

After forming the mirror electrode layer 3 and the solar cell section 4 as films on the first surface of the transparent substrate 2, the obtained light transmissible solar cell module 1 is removed from the vacuum chamber.

Next, an electrode 9 is formed on the surface side of the above-mentioned solar cell section 4. Also, the first connecting wire 10 electrically connected to the electrode 9 and the second connected wire 13 electrically connected to the above-mentioned mirror electrode layer 3 are formed by a printing method or the like using an electrically conductive paste. After this, a light transmissible solar cell module 1 is obtained by carrying out a filling process in which an ultraviolet-curable sheet, a generally used thermoplastic resin, a transparent synthetic resin, such as a polyester resin, a polystyrene resin, a methacrylate resin, a polycycloolefin resin, resins obtained by giving these resins further weatherability, or the like is applied while heating the same. The sheet disclosed in Japanese Laid-Open Patent Application No. 2003-123332 can be appropriately used as the sheet. It is also possible to form the connecting wires 10, 13 after forming the electrode 9 and the carrying out the filling process.

Figure 10:
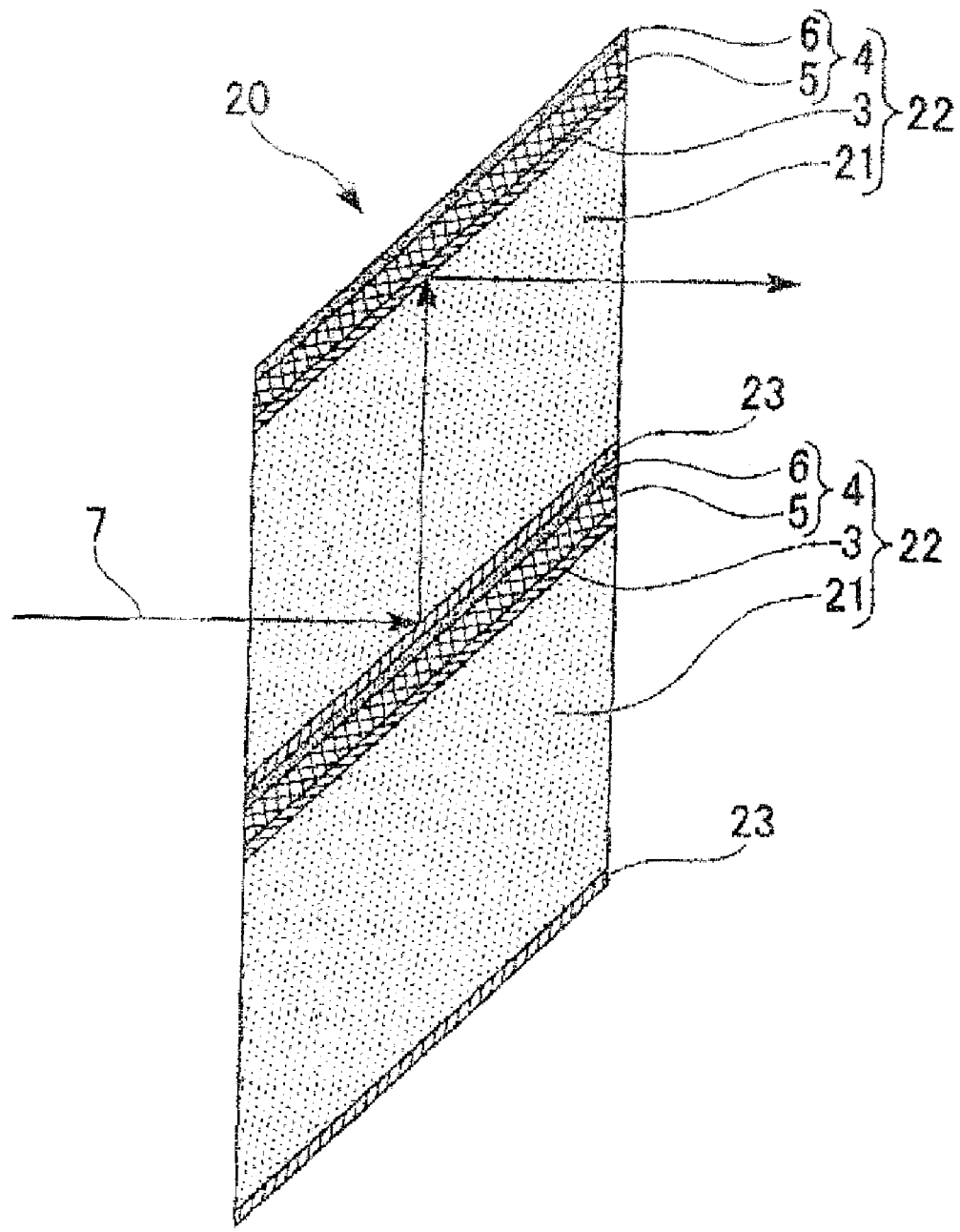
FIG. 10 is a perspective view of the main part of a second embodiment of a light transmissible cell module according to the present invention.

FIG. 10 is a diagram showing a second embodiment of a light transmissible solar cell module of the present invention.

A light transmissible solar cell module 20 of the present embodiment includes multi-level stacked solar cell units 22 including a transparent substrate 21 having first and second surfaces that are approximately parallel, the mirror electrode layer 3 which is provided on a part of the surface of the transparent substrate 21, and a solar cell section 4 provided on the mirror electrode layer 3, wherein these solar cell units 22 are arranged so that the light 7 entering from the outside hits the solar cell section 4 of an arbitrary solar cell module 22 and is reflected, and the reflected light is reflected by the mirror electrode layer 3 of the solar cell layer unit 22 stacked above the above-mentioned arbitrary solar cell unit 22. Although it is not clearly shown in FIG. 10, the light transmissible solar cell module 20 of the present embodiment, similar to the light transmissible solar cell module 1 of the above-mentioned first embodiment, includes a first connecting wire electrically connected with an electrode provided on the surface side of the solar cell section 4 and a second connecting wire electrically connected with the mirror electrode layer 3.

In the light transmissible solar module 20 of the present embodiment, the solar cell units 22 have the mirror electrode layer 3 and the solar cell section 4 sequentially layered on one surface of the transparent substrate 21 having a parallelogram cross-section and the entirety may be formed into a plate-like shape by stacking the transparent substrates 21 of a plurality of the solar cell units 4 using a transparent adhesive layer 23. The cross-section of the transparent substrate 21 is not limited to a parallelogram and may be square, rectangular, or the like.

In the light transmissible solar cell module 20 of the present embodiment, the transparent substrate 21, the mirror electrode layer 3, the solar cell section 4, the electrodes, and the connecting wires can be formed using materials similar to each of the respective parts in the light transmissible solar cell module 1 of the above-mentioned first embodiment.

Figure 11:
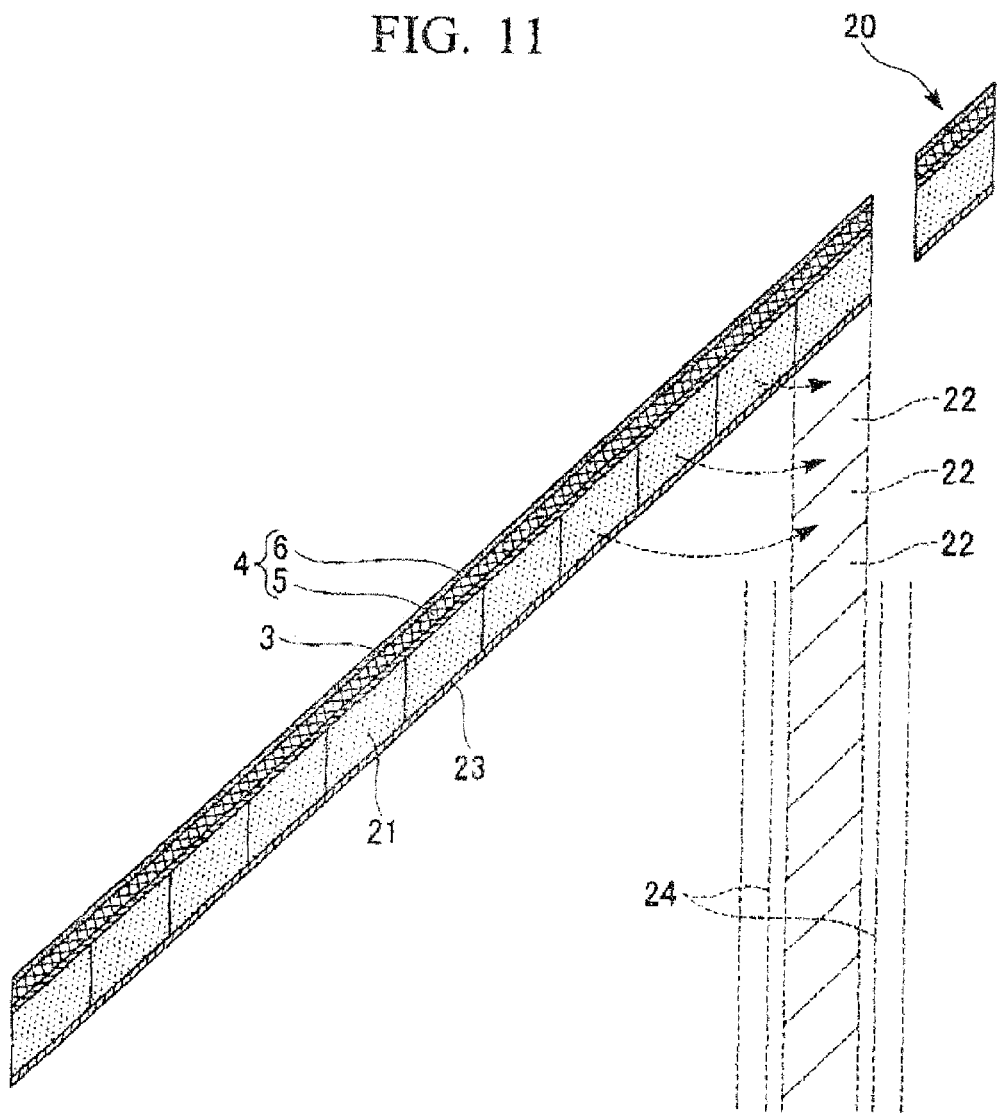
FIG. 11 is a schematic block diagram explaining another example of a process for manufacturing a light transmissible solar cell module according to the present invention.

FIG. 11 is a diagram explaining when the light transmissible solar cell module of the above-mentioned second embodiment is manufactured as another example of a process for manufacturing a light transmissible solar cell module according to the present embodiment.

The manufacturing process according to the present example firstly makes a plate-like transparent substrate by connecting a plurality of transparent substrates 21 having a parallelogram cross-section. To the rear surface (other surface) thereof, a transparent adhesive layer 23 is formed or a transparent double-sided tape is applied so that the plurality of transparent substrates 21 are made into a separable plate-like form.

Next, the above-mentioned transparent substrates 21 connected in a plate-like form are inserted into a vacuum chamber 16 of a thin-film forming device shown in FIG. 9. At this time, the surface of the transparent substrates 21 on which a film is to be formed and that has not been provided with the adhesive layer 23 is set as the lower direction. As shown in FIG. 9, the metallic material 17, which becomes the mirror electrode layer 3, and the semiconductor materials 18, 19, which form the solar cell section 4 are arranged in the vacuum chamber 16 and the transparent substrates 21 and either one or both of the above-mentioned materials are set so as to be able to move relative to each other.

Next, under a high vacuum, a mirror electrode layer 3, a p-type semiconductor layer 5, and an n-type semiconductor layer 6 are sequentially formed on one surface of the transparent substrates 21 to form a solar cell units 22.

Next, the solar cell units 22 are removed from the vacuum chamber 16 and as shown in FIG. 11, are separated into the individual solar cell units 22. Furthermore, many solar cell units 22 are stacked. The plate-like light transmissible solar cell module 20 is obtained by adhesively fixing between each of the solar cell units 22 using the adhesive layer 23 and by applying a transparent reinforcing film 24 around the stacked solar cell units 22 or by coating with a transparent resin.

The above-mentioned embodiment has a structure in which the film-forming process is carried out after making into the form of separable plates by cutting the transparent substrates 21 in advance and joining the same. However, the light transmissible solar cell module 20 can be manufactured by, after forming films without cutting of the transparent substrates 21, cutting into a shape such as that having a parallelogram cross-section or the like and stacking the same.

As shown in FIGS. 12 to 20, the light transmissible solar cell modules 1, 20 in each of the above-mentioned embodiments can form large modules 25A to 25H by arranging a plurality of the light transmissible solar cell modules 1, 20 (4 pieces in each example in FIGS. 12 to 20). Furthermore, solar cell panels can be formed by appropriately fixing these large modules 25A to 25H in a casing.

Figure 12:
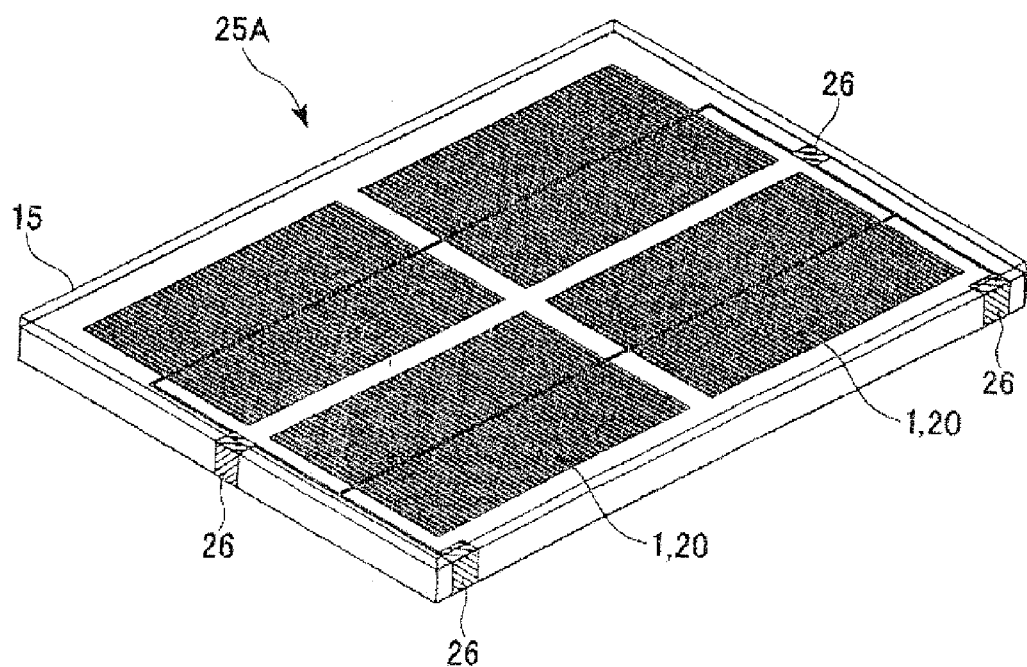
FIG. 12 is a perspective view showing a first example of a large module according to the present invention.
Figure 13:
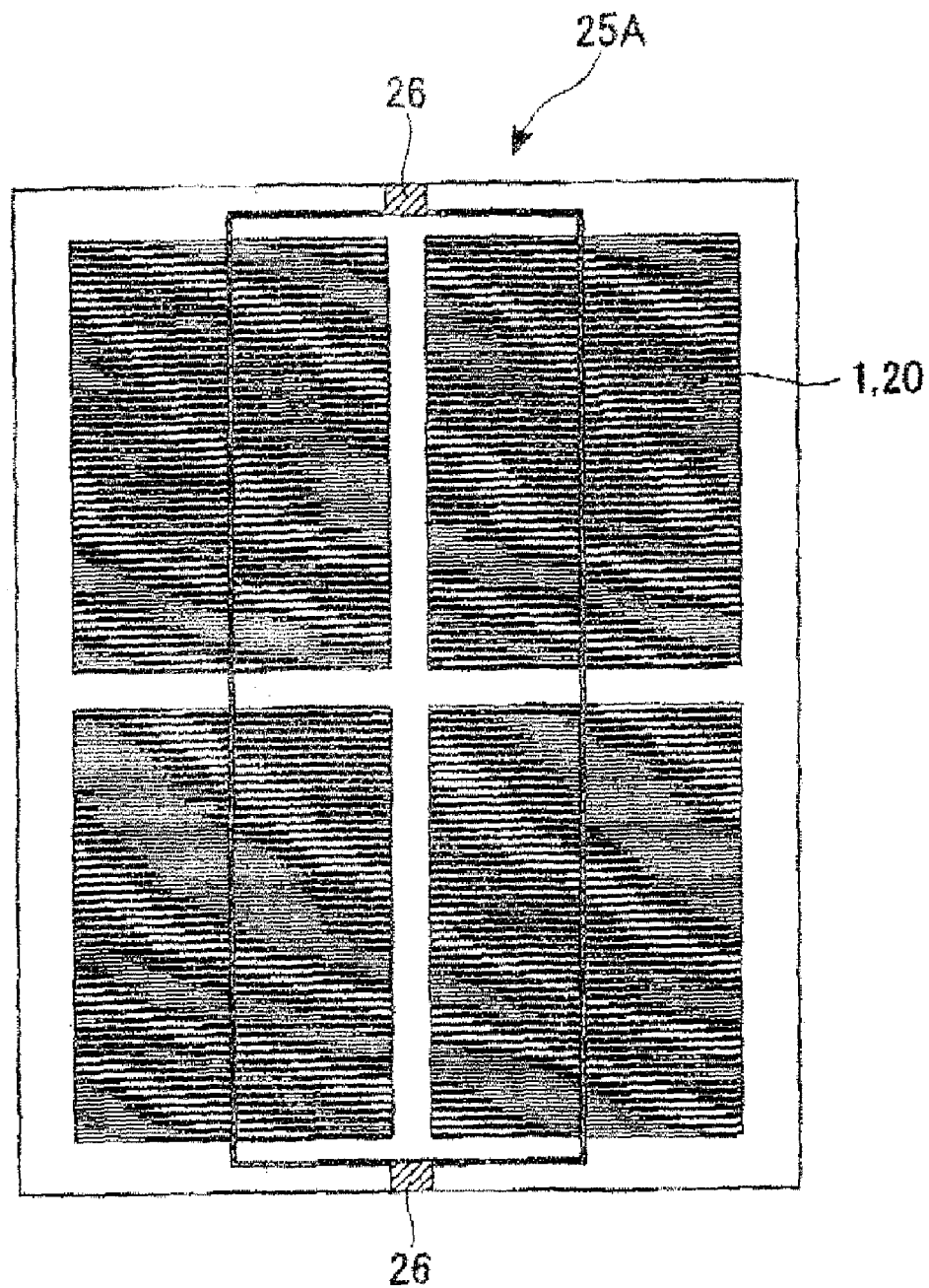
FIG. 13 is a plan view showing the first example of a large module according to the present invention.

FIGS. 12 and 13 are diagrams showing a first example of a large module. This module 25A has an electrode 26 for drawing out electricity arranged in the center of both short sides.

Figure 14:
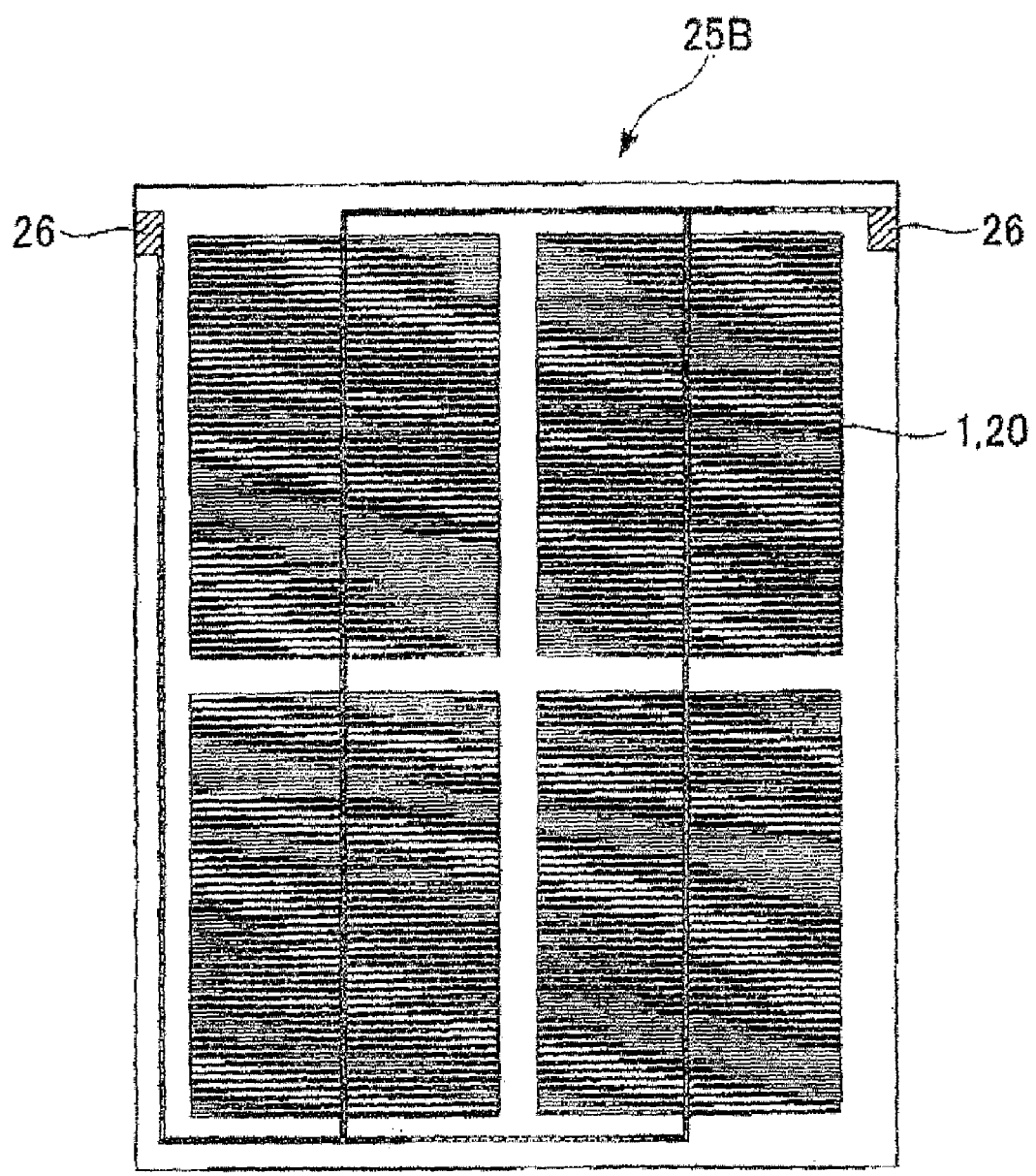
FIG. 14 is a plan view showing a second example of a large module according to the present invention.

FIG. 14 is a diagram showing a second example of a large module. This module 25B has an electrode 26 arranged on both ends of one short side.

Figure 15:
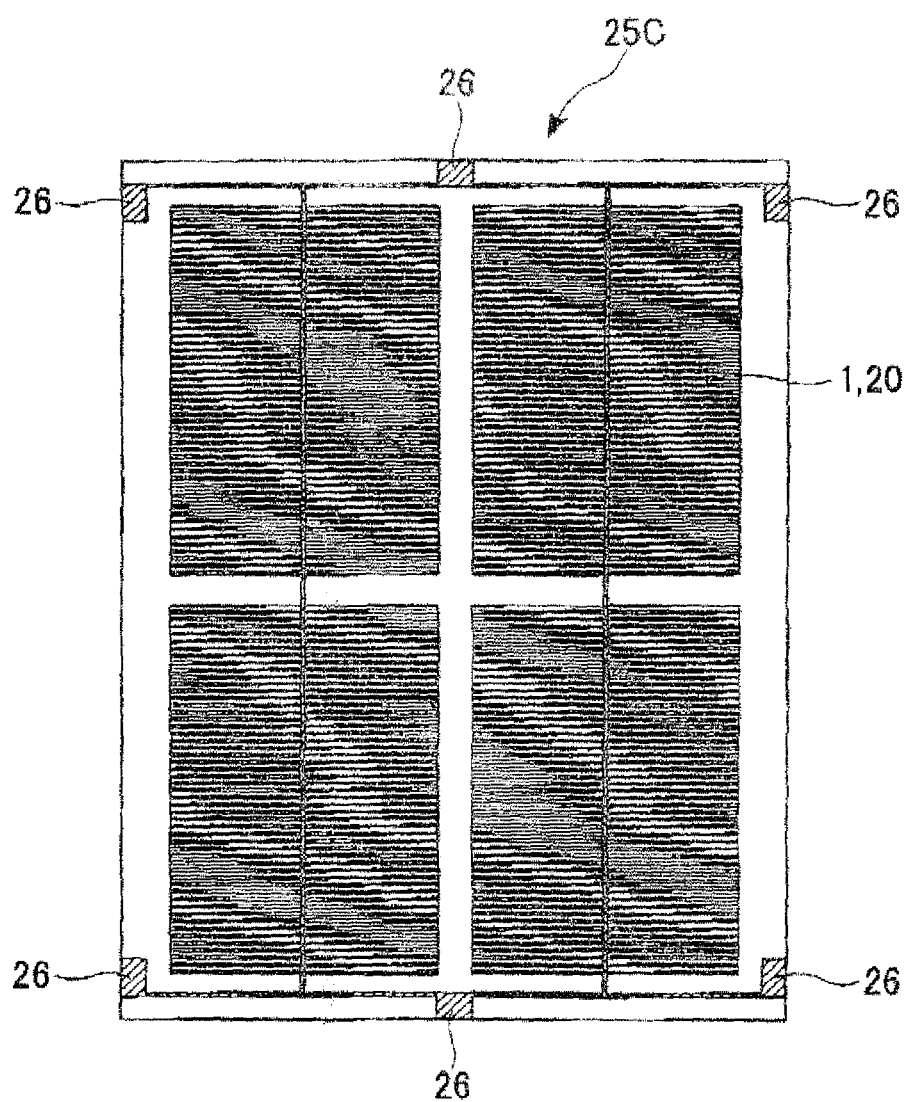
FIG. 15 is a plan view showing a third example of a large module according to the present invention.

FIG. 15 is a diagram showing a third example of a large module. This module 25C has an electrode 26 arranged in the center of both short sides and on both ends of both short sides.

Figure 16:
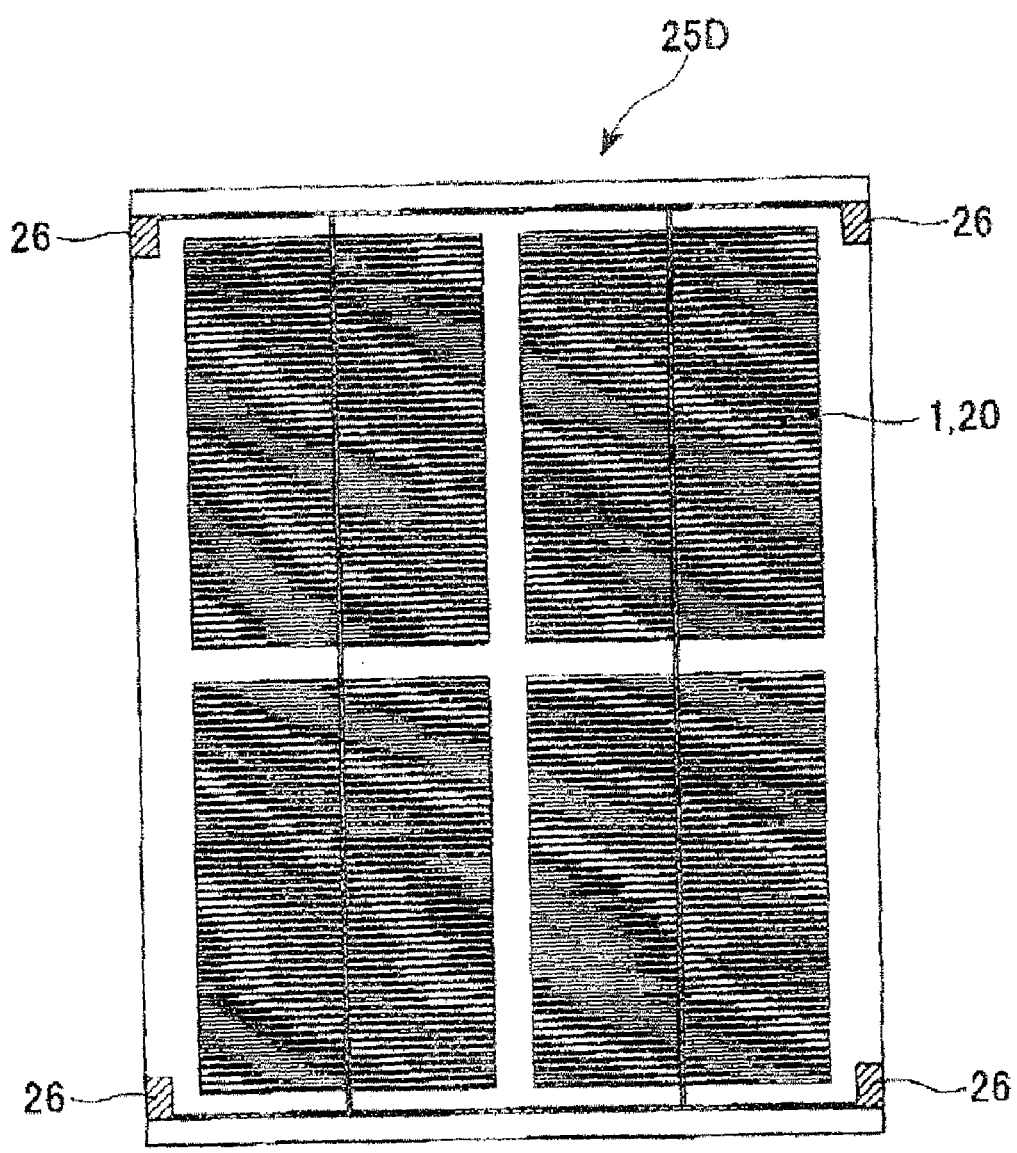
FIG. 16 is a plan view showing a fourth example of a large module according to the present invention.

FIG. 16 is a diagram showing a fourth example of a large module. This module 25D has an electrode 26 arranged on both ends of both short sides.

Figure 17:
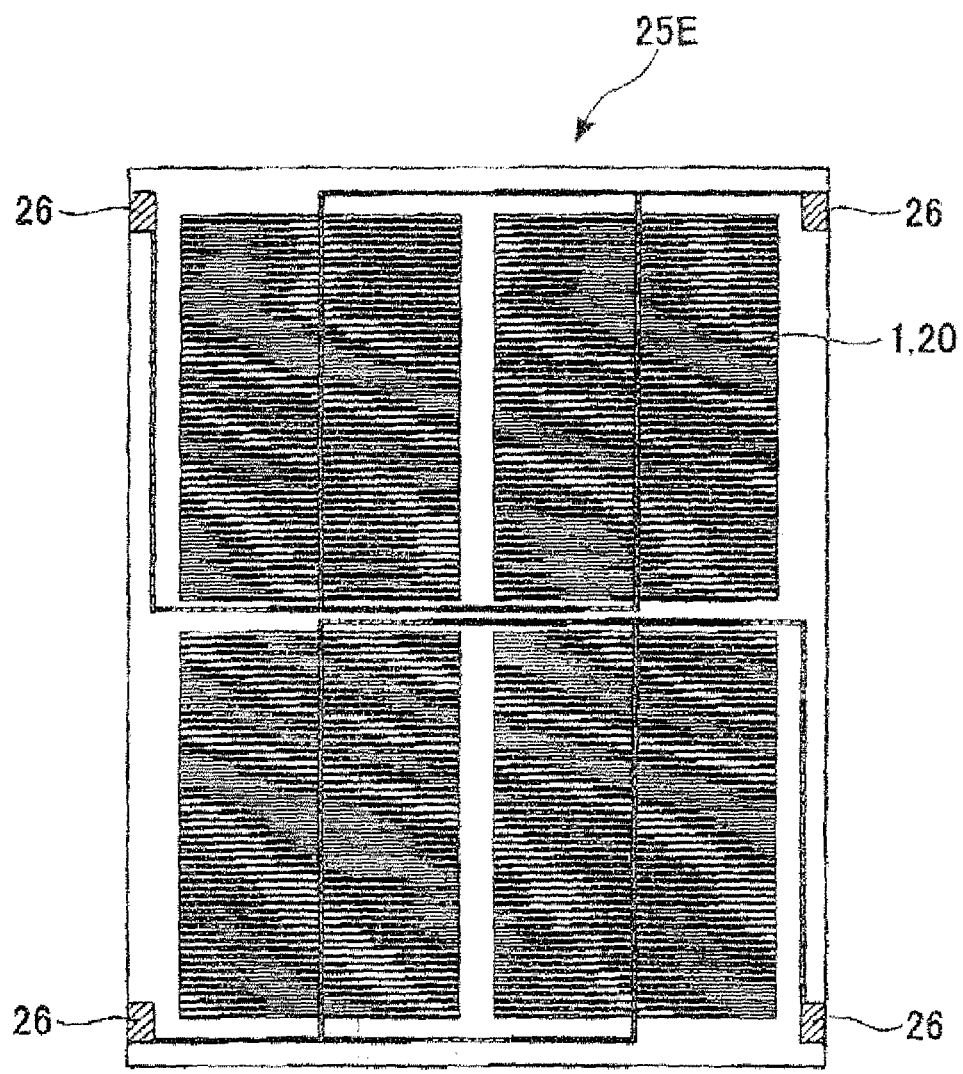
FIG. 17 is a plan view showing a fifth example of a large module according to the present invention.

FIG. 17 is a diagram showing a fifth example of a large module. This module 25E has an electrode 26 arranged on both ends of both short sides.

Figure 18:
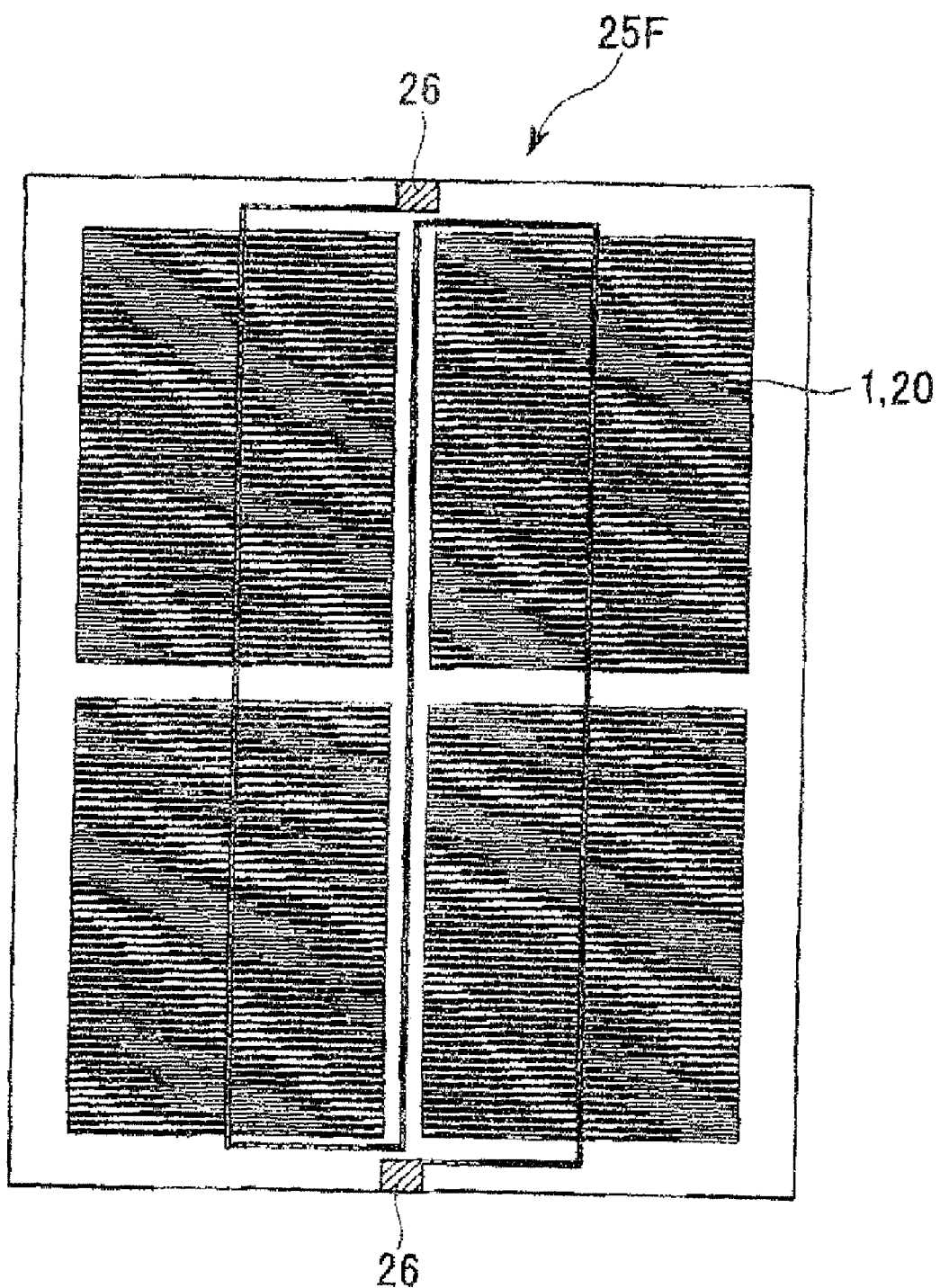
FIG. 18 is a plan view showing a sixth example of a large module according to the present invention.

FIG. 18 is a diagram showing a sixth example of a large module. This module 25F has an electrode 26 arranged in the center of both short sides.

Figure 19:
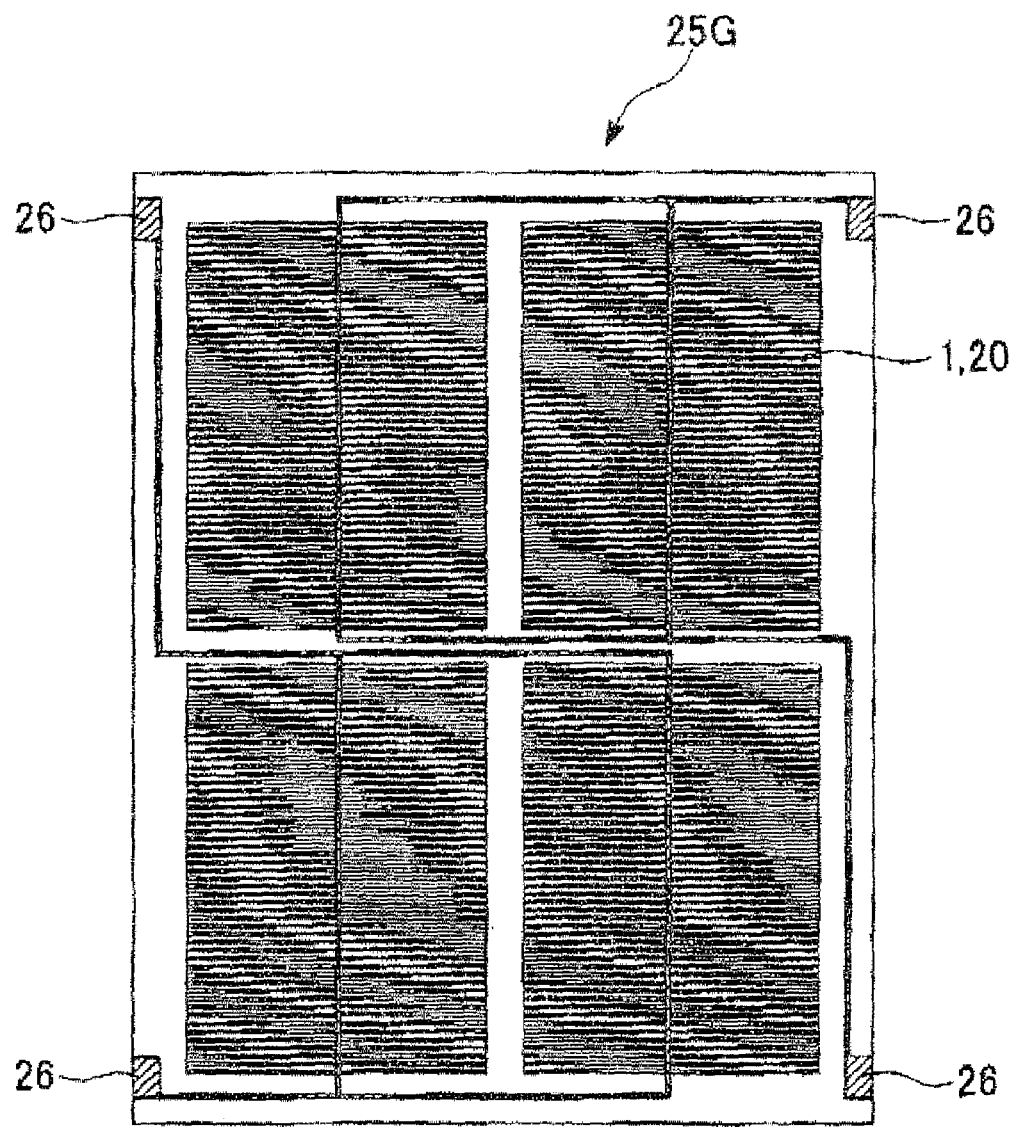
FIG. 19 is a plan view showing a seventh example of a large module according to the present invention.

FIG. 19 is a diagram showing a seventh example of a large module. This module 25G has an electrode 26 arranged on both ends of both short sides.

Figure 20:
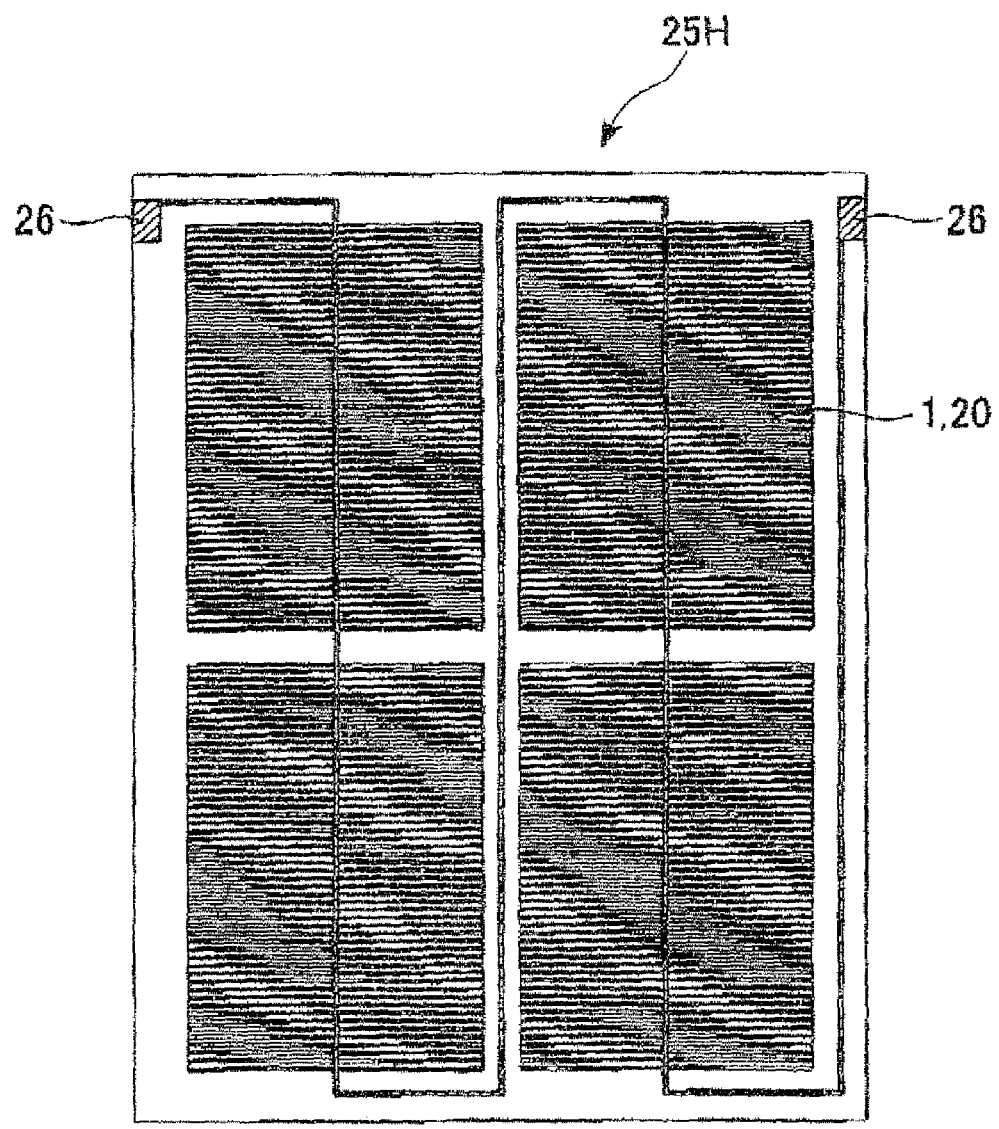
FIG. 20 is a plan view showing an eighth example of a large module according to the present invention.

FIG. 20 is a diagram showing an eighth example of a large module. This module 25H has an electrode 26 arranged on both ends of one short side.

Figure 21:
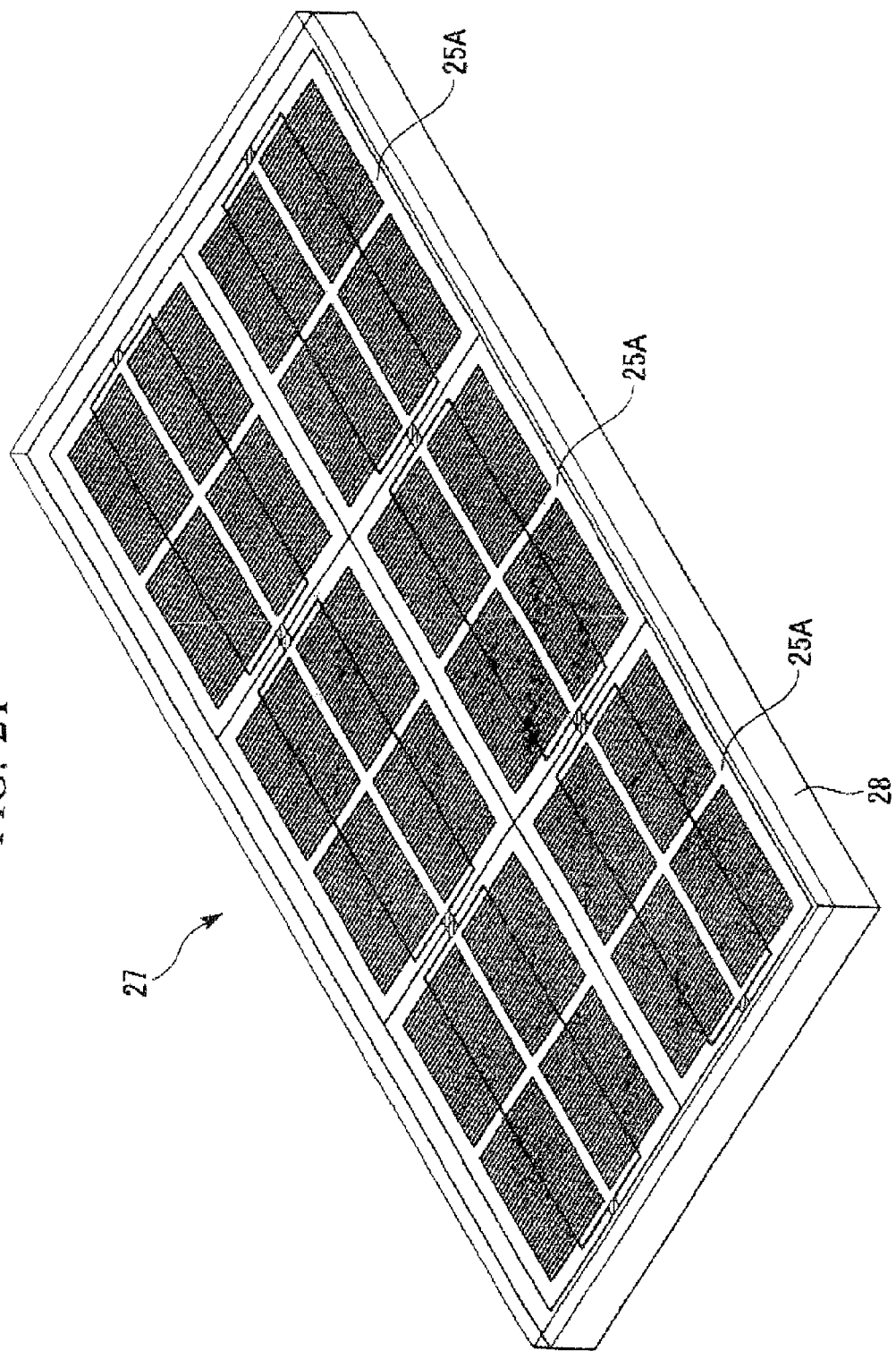
FIG. 21 is a perspective view showing an embodiment of a solar cell panel according to the present invention.

FIG. 21 is a diagram showing an embodiment of a solar cell panel of the present invention. A solar cell panel 27 of the present embodiment has a structure in which the above-mentioned large module 25A is arranged in 3 columns×2 rows and fixed in a casing 28. The number and arrangement of the modules mounted in the solar cell panel 27 of the present invention is not particularly limited. Also, so that light can transmit through the modules it is desirable that a casing 28 is a frame structure or is made from a transparent material.

According to the present invention, solar cells having superior light transmissibility and excellent power generating efficiency can be provided.

Having thus described several exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the invention is limited and defined only by the following claims and equivalents thereto.

What is claimed is:

1. A light transmissible solar cell module comprising:
    solar cell units, which comprise a transparent substrate, a mirror electrode layer provided on one surface of multiple projecting portions of the transparent substrate comprising multiple projecting portions with a saw edge cross-section formed by connecting projecting portions having a first surface and a second surface that intersects with the first surface, and a solar cell section provided on the mirror electrode layer, arranged in multi-levels;
    a first connecting wire electrically connected to an electrode provided on a surface side of the solar cell section; and
    a second connecting wire electrically connected to the mirror electrode layer, wherein
        the solar cell units are arranged so that a light entering from one side hits the solar cell section of an arbitrary solar cell unit and is reflected, and the reflected light reaches another side by being reflected by the mirror electrode layer of a solar cell unit arranged adjacent to the arbitrary solar cell unit.

2. The light transmissible solar cell module according to claim 1, wherein the entire module is formed into a plate-like shape by filling hollows between the projecting portions of the multiple projecting portions with a transparent resin.

3. A solar cell panel formed by fixing light transmissible solar cell modules according to any one of claims 1 or 2 in a casing.

4. A process for manufacturing a light transmissible solar cell module, comprising:
    forming a mirror electrode layer by forming a metallic material as a film on one surface of multiple projecting portions of a transparent substrate comprising multiple projecting portions with a saw edge cross-section formed by connecting projecting portions having a first surface and a second surface that intersects with the first surface;
    forming a solar cell section by forming a semi-conductor material as a film on the mirror electrode layer to manufacture solar cell units; and
    obtaining the light transmissible solar cell module by forming a first connecting wire electrically connected with an electrode provided on a surface side of the solar cell section and a second connecting wire electrically connected to the mirror electrode layer, wherein the solar cell units are arranged so that a light entering from one side hits the solar cell section of an arbitrary solar cell unit and is reflected, and the reflected light reaches another side by being reflected by the mirror electrode layer of a solar cell unit arranged adjacent to the arbitrary solar cell unit.

5. The process according to claim 4 further comprising forming the entire module in a plate-like shape by filling hollows between the projecting portions of the multiple projecting portions with a transparent resin.

* * * * *